(12) United States Patent
Slavin

(10) Patent No.: US 6,950,048 B1
(45) Date of Patent: Sep. 27, 2005

(54) DITHER SYSTEM FOR A QUANTIZING DEVICE

(75) Inventor: Keith R. Slavin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/817,477

(22) Filed: Apr. 2, 2004

(51) Int. Cl.$^7$ .......................... H03M 1/20; H03M 1/12
(52) U.S. Cl. ....................... 341/131; 348/574
(58) Field of Search ............... 341/131, 155, 341/118, 120, 161; 331/16; 348/574; 375/243

(56) References Cited

U.S. PATENT DOCUMENTS

| | | | | |
|---|---|---|---|---|
| 4,524,447 A | * | 6/1985 | Willis et al. | 375/243 |
| 4,812,846 A | | 3/1989 | Noro | |
| 5,493,298 A | * | 2/1996 | Bartz | 341/131 |
| 5,825,253 A | * | 10/1998 | Mathe et al. | 331/18 |
| 5,940,138 A | * | 8/1999 | Lowe | 348/574 |
| 5,986,512 A | * | 11/1999 | Eriksson | 331/16 |
| 6,268,814 B1 | * | 7/2001 | Kolsrud | 341/131 |
| 6,577,257 B2 | * | 6/2003 | Brooks | 341/131 |
| 6,825,784 B1 | * | 11/2004 | Zhang | 341/131 |
| 6,880,262 B1 | * | 4/2005 | Jensen | 341/155 |

OTHER PUBLICATIONS

A.J.E.M. Janssen, "Fourier Analysis and Synthesis for a Mildly Non-Linear Quantizer" Philips Research Laboratories 1999, no month.

* cited by examiner

Primary Examiner—Patrick Wamsley
(74) Attorney, Agent, or Firm—Francis I. Gray

(57) ABSTRACT

A dither system for a quantizing device, such as a multi-stage pipelined analog-to-digital converter (ADC), derives a dither signal from a clock signal having a sample frequency, the dither signal having a frequency that is one-third of the sample frequency. The dither signal is easily converted to analog and added at the input of the quantizing device to an analog signal to be digitized. A cancellation signal circuit generates a cosine-wave signal from a digital version of the dither signal and programmable coefficients that are a function of amplitude and phase. The cosine-wave signal is combined with the digital output signal from the quantizing device to produce a corrected digital output signal having reduced quantization distortion.

4 Claims, 1 Drawing Sheet

DITHER SYSTEM FOR A QUANTIZING DEVICE

BACKGROUND OF THE INVENTION

The present invention relates generally to dither for quantizing devices, and more particularly to the correction of quantization errors in electonic devices or systems such as analog-to-digital converters (ADCs), and more specifically multi-stage ADCs.

Fourier theory requires that:
a) all repetitive signals of period T may be expressed as a sum of a DC offset, a fundamental sine wave of period T, and the harmonics of the fundamental;
b) the fundamental and harmonics each have an amplitude and phase that is uniquely defined by the shape of the repetitive signal.

A sine frequency is the reciprocal of its period or cycle time, so the fundamental frequency is 1/T cycles per second or Hertz. A harmonic of a sine wave of period T is a frequency that is an integer multiple of the fundamental frequency so the $n^{th}$ harmonic has frequency n/T or a period of T/n.

In mathematical terms a real signal Y(t) that repeats with frequency f may be expressed as:

$$Y(t) = DC + \sum_{n=1-M} (A(n, f)\sin(2\pi nft + P(n, f)))$$

A(n, f) is the amplitude of the $n^{th}$ harmonic for the fundamental frequency and P(n, f) is the corresponding phase. Also $2\pi f = \omega$ in radians/second, the unit of angular frequency, so there are $2\pi$ radians in a circle or cycle. In realizable systems the passage of high frequencies, and therefore high harmonics, is limited. For example analog systems are limited by maximum drive current capabilities and capacitive loading so in practice M does not extend to infinity. A repetitive signal may then be defined in terms of T and two finite sets of M amplitudes {A} and phase {P}.

If the fundamental frequency is applied to the input of a non-linear device such as a quantizing device, then the output consists of the fundamental itself and its various harmonics. As the input has no harmonics, the amplitude of each harmonic of the system output relative to the amplitude of the fundamental is a measure of its harmonic distortion. Spurious Free Dynamic Range (SFDR) is a measure of the relative size of the largest harmonic with respect to the fundamental for a defined range of pure sine-wave input frequencies. ADCs usually have a much better measured SFDR for inputs having more frequency components.

ADC quantization distortion has a certain amount of energy associated with the quantization voltage step. The Fourier Theorem implies that harmonic distortion only lies at frequencies related to those at the input. Inputs that have more frequency components spread the quantization noise energy out into many intermodulation and harmonic distortion components, usually reducing the amplitude of each harmonic component. Conversely harmonic distortion in ADCs is most apparent for single sine-wave inputs. In this case quantization harmonics may be severe, as no intemodulation mechanism is present, so the quantization energy that is not noise manifests itself as harmonic distortion. Furthermore minor changes in the input signal cause large changes in the harmonic profile, so any distortion cancellation mechanism is unable to cancel quantization harmonic distortion. Finally even high harmonics may have considerable energy—limited only by the bandwidth of the ADC.

The "fingerprints" of quantization distortion are:
a) rapid changes in harmonic profiles with even small changes in the input;
b) if the input sinusoid changes smoothly, the harmonics seem to vary relative to each other, but over a similar amplitude range; and
c) the harmonic profile extends out to the maximum bandwidth allowed by the analog system.

Dither may be added to ADC inputs to reduce quantization distortion. The effectiveness of dither relies on the fact that even small inputs to an ADC cause quantization harmonic distortion, as the distortion mechanism is a natural consequence of transitioning between voltage levels on a periodic basis. In fact the quantization distortion is closely related to the ADC quantization step sizes being exercised, and not to the size of the input signal.

Dither in the form of noise may be added into the input of an ADC to help spread the energy of the quantization noise so that it is no longer a problem. Unfortunately some multi-stage ADCs produce quantization distortion at earlier stages in the ADC pipeline, so dither added into the signal may have to be much larger to reduce quantization effects. The large amplitude dither is needed because multi-stage pipelined ADCs require large amplitude to excite dither in the least-significant bit (LSB) of the most significant stage of the ADC in order to reduce the quantization noise. This most significant stage may be only a few bits, so dither around 1/16 of the total input range may be needed. If large amplitude signals are added into the ADC input, they must be accurately subtracted from the ADC digital output.

An approach for adding and canceling a relatively large dither signal is to generate a large, accurate digital sampled sine wave, convert it to an analog signal, add it to the ADC input, and then subtract it out digitally from the ADC output. Such a dither circuit for improving quantization distortion in analog-digital and digital-analog conversion is shown in U.S. Pat. No. 4,812,846 where dither in the form of a frequency signal at one-half of the sampling frequency is added to an input signal and subtracted from an output signal of the converter. The dither signal may be easily generated as it is at ½ $f_s$, so a digital divide-by-two on the clock generates the required frequency with all its harmonics at $f_s/2$ or at DC. The disadvantage is that at each sampling instant the dither has only two different added voltage levels, with limited effectiveness in the spreading of quantization energy.

What is desired is a dither method for a quantizing device, especially a multi-stage analog-to-digital converter (ADC), that reduces quantization noise more effectively.

BRIEF SUMMARY OF THE INVENTION

Accordingly the present invention provides a dither system for a quantizing device, such as a multi-stage pipelined analog-to-digital converter (ADC), that derives a dither signal from a clock signal having a sample frequency, the dither signal having a frequency that is one-third of the sample frequency. The dither signal is easily converted to analog and added at the input of the quantizing device to an analog signal to be digitized. A cancellation signal circuit generates a cosine-wave signal from a digital version of the dither signal. The cosine-wave signal is combined with the digital output signal from the quantizing device to cancel the dither signal to produce a corrected digital output signal with reduced quantization noise.

The objects, advantages and other novel features of the present system are apparent from the following detailed description when read in conjunction with the appended claims and attached drawing.

DETAILED DESCRIPTION OF THE INVENTION

Figure 1:
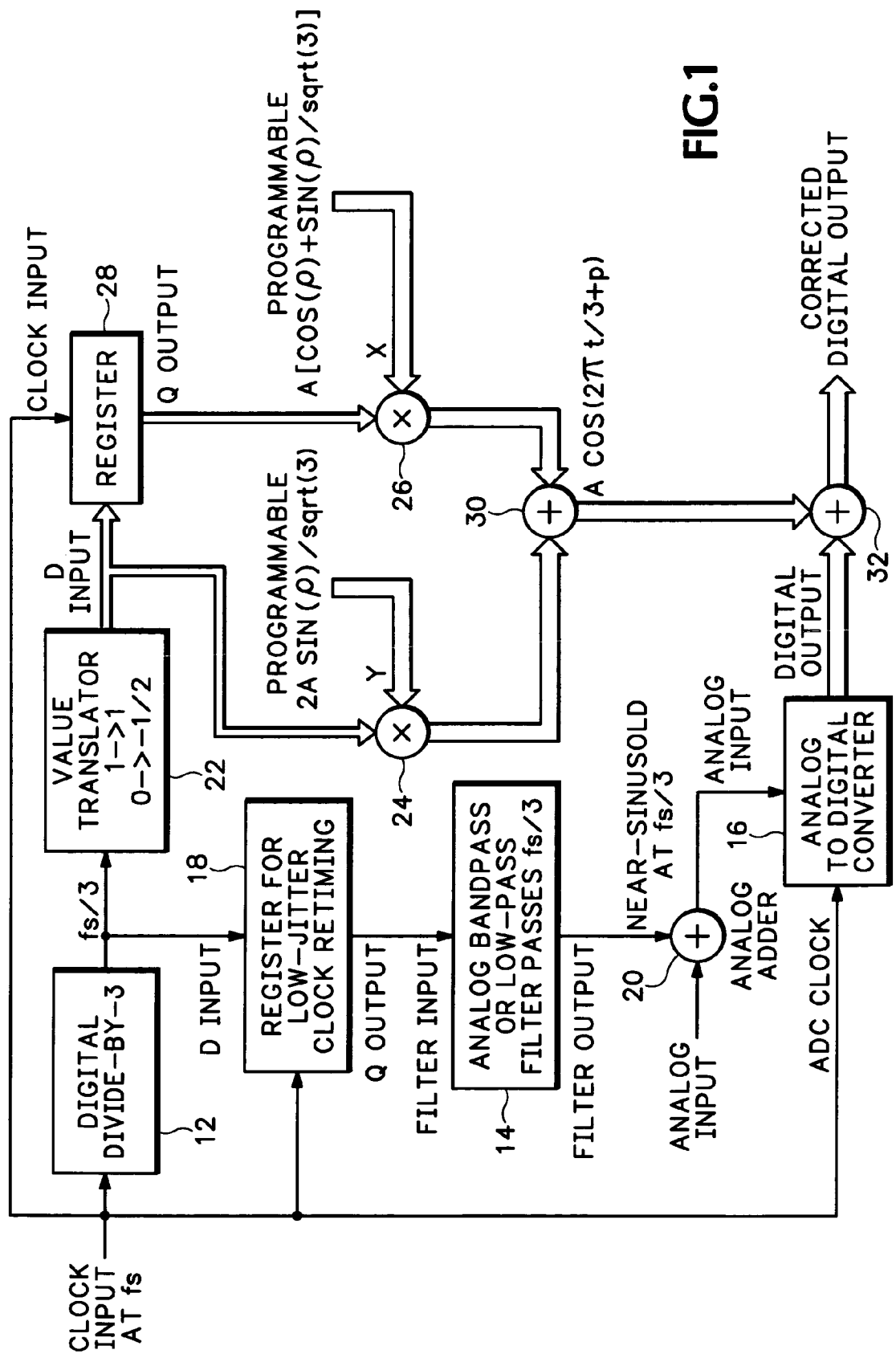
FIG. 1 is a block diagram view of a dither system for a quantizing device according to the present invention.

Referring now to FIG. 1, a clock signal having a sample frequency of $f_s$ is input to a divide-by-three circuit 12 to generate the following sequence:

$$W(t) = (1, 0, 0, 1, 0, 0, 1, 0, 0, 1, \ldots)$$

or alternatively $$W(t) = (1, 1, 0, 1, 1, 0, 1, 1, 0, 1, \ldots)$$

or any other sequence having a repetition period of $f_s/3$ such that its harmonics are at $(2f_s/3, 3f_s/3, 4f_s/3, 5f_s/3, 6f_s/3, \ldots)$. These frequencies alias to sampled frequencies $(f_s/3, DC, f_s/3, f_s/3, DC, \ldots)$. A simple bandpass or lowpass analog filter 14 applied to the digital sequence removes DC and most of the harmonics prior to entry into a multi-stage ADC 16, although the filter performance is not critical as the non-DC harmonics all lie on $f_s/3$. More importantly the serial digital stream is re-clocked with a low-phase-noise, or low-jitter, register device 18, as noise on its output is being sampled by the ADC 16. The resulting output from the analog filter 14 is a near-sinusoid at $f_s/3$ which is input to an adder 20 to which also is input an analog signal to be digitized. The output of the adder 20 is the input to the ADC 16. As with U.S. Pat. No. 4,812,846, an important advantage of this method of generating an analog sine-wave dither input is that no high-precision digital-to-analog converter (DAC) is needed. However there are now typically three different added voltage levels at each sampling instant, increasing the dither effectiveness.

A circuit to accurately cancel $f_s/3$ on the ADC 16 output uses the following relations:

for a desired phase p and two values q=1 and r=±1, then two variables S and C are defined as $$S = r\sin(p) \qquad C = q\cos(p)$$

$$g(t) = A((S/SQRT(3)) - C)\cos(2\pi t/3) + (2AS/SQRT(3))\cos(2\pi(t+1)/3)$$

Using basic trigonometric properties:

For q = −1 and r = 1:
$$g(t) = -qA\cos((2\pi t/3) - qrp)$$
$$g(t) = A\cos((2\pi t/3) + p)$$

This is an $f_s/3$ cosine with amplitude A and phase p

Therefore $$g(t) = X\cos(2\pi t/3) + Y\cos(2\pi(t+1)/3)$$

where {X,Y} are given by $$X = A(\cos(p) + \sin(p)/SQRT(3))$$

$$Y = 2A\sin(p)/SQRT(3)$$

These values may be calculated for a particular amplitude and phase, and then programmed into registers (not shown) for realtime generation of the cancellation cosine-wave. The first cosine expression takes on the values:

$$\{1, -\tfrac{1}{2}, -\tfrac{1}{2}, 1, -\tfrac{1}{2}, -\tfrac{1}{2}, \ldots\}$$

for $t = \{0,1,2,3,4,5, \ldots\}$. Comparing the sequences above shows a mapping of 1->1 and 0->−½, so the cosine values may easily be generated from the output of the divide-by-three circuit 12 by a value translator 22. The restricted set of values makes the multiplication hardware 24, 26 needed trivially small. The second cosine expression is simply the above sequence delayed by one sample clock by a register 28. The outputs from the multiplication hardware 24, 26 are input to an adder 30 to produce the cancellation cosine-wave. The cancellation cosine-wave is input to a summation circuit 32 to subtract the input dither signal from the digital output of the ADC 16, producing the desired reduced quantization effect in the digital output.

The coefficients for input to the multiplication hardware 24, 26 may readily be calibrated by varying the values of A and p and observing the corrected digital output of the ADC 16 from the output summer 32 for just the dither signal. For calibration the number of samples used is a tradeoff between speed and accuracy--more samples=greater accuracy and fewer samples=greater speed. Starting from an initial cancellation signal having initial values of A and p, set the digital version of the dither signal to have the same initial amplitude/phase values and acquire the corrected digital output signal. Calculate the amplitude and phase of the corrected digital output signal and of the $f_s/3$ signal. Then apply the equations for X and Y to generate the appropriate cancellation signal according to the equation for g(t), as shown above, by calculating the amplitude and phase values that produce an essentially zero output signal.

Thus the present invention provides dither for a multi-stage ADC by generating a relatively large amplitude sinusoid as a dither signal having one-third of the frequency of a sample clock, which dither signal is converted to analog and added to an analog signal at the input of the ADC, and then generating a cosine-wave cancellation signal for subtracting the dither signal at the output of the ADC such that the digital output has reduced quantization distortion.

What is claimed is:

1. A dither system for a quantizing device comprising:
   means for obtaining a dither signal from a clock signal having a sample frequency, the dither signal having a frequency that is one-third of the sample frequency;
   means for combining the dither signal with an analog signal to be digitized at an input to the quantizing device;
   means for generating from a digital version of the dither signal from the obtaining means a cancellation signal; and
   means for combining the cancellation signal with a digital output signal from the quantizing device to produce a corrected digital output signal having reduced quantization distortion.

2. The dither system as recited in claim 1 wherein the obtaining means comprises:
- a divide-by-three circuit having the clock signal as an input and the digital version of the dither signal as an output; and
- means for filtering the digital version of the dither signal to produce as an output the dither signal for input to the dither signal combining means.

3. The dither system as recited in claim 2 wherein the obtaining means further comprises a low-jitter clock re-timing register having as an input the digital version of the dither signal and having as an output a re-timed digital version of the dither signal for input to the filtering means.

4. The dither system as recited in any of claims 1–3 wherein the cancellation signal generating means comprises:
- means for translating the digital version of the dither signal into a direct digital version;
- means for delaying the direct digital version by one cycle of the clock to produce a quadrature digital version;
- means for multiplying the direct and quadrature digital versions by respective programmable coefficients to produce quadrature digital products; and
- means for combining the quadrature digital products to produce the cancellation signal.

* * * * *